Nov. 7, 1967 F. D. WOOD 3,351,701

ELECTRONIC PACKAGE ASSEMBLY

Filed Feb. 25, 1965

INVENTOR.
FRANKLIN D. WOOD
BY
[signature]

3,351,701
ELECTRONIC PACKAGE ASSEMBLY
Franklin D. Wood, Cudahy, Wis., assignor to Allen-Bradley Company, Milwaukee, Wis., a corporation of Wisconsin
Filed Feb. 25, 1965, Ser. No. 435,185
3 Claims. (Cl. 174—52)

ABSTRACT OF THE DISCLOSURE

An electronic package assembly with opposed end caps and supports forming an independently rigid assembly. An electronic element between said end caps but attached to conducting leads passing therethrough. The electronic element is of a type having a flat substrate carrying a circuit element. The volume between said end caps is enclosed by a shield member.

The present invention relates to a package assembly for encasing small electronic components and/or miniature electrical circuits. More specifically, the invention pertains to a package assembly having a pair of end caps joined by a common shield. Protruding substantially transversely through the end caps are electronic leads which are attachable to small internal circuitry (small electronic components and/or miniature electrical circuits) positioned between the end caps and also to electrical apparatus positioned externally to the assembly.

Presently, there are various package assemblies available for encasing small electronic components, integrated circuits, monolithic diffused circuits and other small circuits. Common apparatus for packaging such devices includes flat packages comprising ceramic or glass materials. To date flat packages have proven satisfactory for encasing small circuits. The circuits are generally very small and require only small pieces of ceramic which are relatively inexpensive. Though individual small circuits are widely used, there is a big demand for multiple monolithic diffused circuits, thin film, cermet and cordwood type circuitry or combinations thereof to attain the desired electronic function. Obviously, multiple monolithic circuits require a larger package than individual circuits. Also, thin film, cermet and cordwood-type circuitry are generally larger than monolithic circuitry by as much as a factor of ten. These circuits cannot be satisfactorily accommodated by a flat package of conventional size. Frequently, it is desirable to encase small transistors and diodes with thin film, cermet and cordwood circuitry. To derive a ceramic or glass flat package to accommodate these circuits and/or components a much larger piece of ceramic or glass material is required. Not only is a large ceramic and glass piece expensive, but they are generally very fragile and difficult to work with. Due to their fragility, much care must be taken during the fabrication process—this adds time and expense to the fabrication processing.

The present invention discloses a package assembly which will accommodate thin film circuitry, cordwood circuitry, cermet circuitry, monolithic diffused circuits, small electronic components or combinations thereof, whichever is desired. Though the structure is not so limited, it may comprise metallic elements. Incorporating metallic elements offers many advantages. The metallic elements are easy to work with, sturdy and less fragile than conventional ceramic or glass materials. The metallic package assembly will withstand shock and vibrations frequently witnessed in assembly line procedures and which are otherwise untolerable by ceramics and glass. Metallic elements may be fabricated by a stamping process and are relatively inexpensive to produce. The invention also teaches that a support member may be incorporated between end caps to provide a self-supporting carrier during the fabrication procedures. Some known package assemblies require separate apparatus to carry and support the package assembly during fabrication which apparatus is disposed of upon completion of fabrication. The support member of the present invention may become permanent and retained throughout the life of the final assembled package.

The sturdier structural construction is also an aid in the final package assembly which includes the encased internal circuitry. The final package assembly will withstand shocks and vibrations within the electronic equipment in which it is incorporated. Also, proper selection of materials provides a package assembly which has electrical advantages as well as structural advantages. Use of ferri-magnetic or ferro-magnetic materials provides a package assembly which serves as an electro-static and/or electro-magnetic shield thereby protecting the internal circuitry from stray fields. Proper selection of materials provides a package which is hermetically sealed thus protecting the internal circuitry and components from humidity and other atmosphere contaminants. Also, since a plurality of circuits and/or components may be included in a single enclosure, they will all be at substantially the same temperature.

Accordingly, it is an object of the present invention to provide a package assembly to accommodate thin film circuitry, cermet circuitry, cordwood circuitry, monolithic diffused circuits, electronic components or combinations thereof, and which assembly is relatively inexpensive and adapted for production line assembly procedures.

It is a further object to provide an electronic package assembly which permits full test of the internal circuitry prior to final encapsulation.

It is a further object to provide an electronic circuit package assembly which may, by proper selection of materials, serve as an electro-static and/or electro-magnetic shield for the internal circuitry from stray fields.

It is a further object to provide an electronic circuit package assembly which may be encapsulated to provide a hermetically sealed package.

It is a further object to provide an electronic circuit package assembly which may be adapted to withstand substantial shocks and vibrations both during fabrication and during operation.

It is a further object to provide an electronic circuit package assembly which affords simplified fabrication procedures wherein a reduction in fabrication costs in materials and labor is realized.

It is a further object to provide a package assembly which may be adapted to serve as a self-supporting carrier during the fabrication procedures of enclosing internal circuitry within the package assembly.

The foregoing and other objects will appear in the description to follow. In the description, reference is made to the accompanying drawings which form a part hereof in which there is shown by way of illustration, a specific embodiment in which this invention may be practiced. The embodiment will be described in sufficient detail to enable those skilled in the art to practice this invention, but it is to be understood that other embodiments of the invention may be used and that changes may be made in the embodiment without deviation from the scope of the invention. Consequently, the following detailed description is not to be taken in a limiting sense; instead, the scope of the present invention is best defined by the appended claims.

Figure 1:
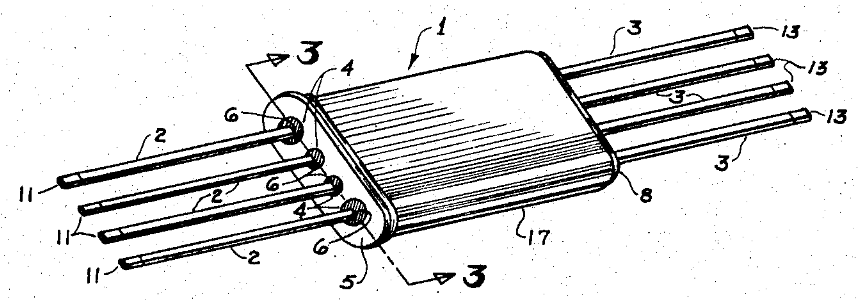
FIG. 1 illustrates, in perspective, a view of an encased package assembly according to this invention.

Referring more specifically to the drawings, the package assembly is designated by the general reference character 1. The assembly 1 has a plurality of conducting leads 2 protruding from one end and a plurality of conducting leads 3 extending from the other end. The leads may be a ribbon or round configuration. Their design forms no part of this invention, but due to their ease of welding, ribbon leads are generally preferred. Each of the leads 2 protrude through an aperture 4 of an end cap 5 having a substantially oblong cross-sectional shape with the opposite long sides being substantially flat and parallel with one another. Intermediate each of the apertures and its associated leads is an insulating sealer 6 such that the end cap 5 is electrically insulated from the leads and the leads insulated from each other. Each of the leads 3 protrude through an aperture 7 of an end cap 8 having a substantially oblong cross-sectional shape with the opposite long sides being substantially flat and parallel with one another. Intermediate the apertures 7 and the leads 3 is a sealer 9 similar to the sealer 6.

Each of the leads 2 has an external end surface 11 for attachment to external apparatus. Each lead also has an end surface 12 for connection to internal circuitry between the end caps 5 and 8. Likewise, the leads 3 each have an external end surface 13 for connection to external apertures and an internal end surface 14 for connection to internal circuitry. As previously mentioned, various small electronic circuit configurations may be accommodated. The electronic circuit may be individual components or circuits. For example, it may include monolithic diffused circuitry, cermet circuitry, thin film circuitry, cordwood circuitry, resistors, capacitors, transistors, diodes, etc. or combinations thereof.

The illustrated embodiment also includes a pair of support members 15 and 16 extending between and engaging the end caps 5 and 8. It was previously mentioned that the present carrier may be self-supporting. This is one function of the support members 15 and 16. The support members 15 and 16 support the end caps 5 and 8 in place. Thus, during the assembly process of attaching internal circuitry to the leads 2 and 3, the caps, themselves, do not exert any stress or strain on the internal circuitry or components. During fabrication of the internal circuitry to the carrier, no separate carrier is required to hold the end caps in place while an assembler inserts the internal circuitry or transports it along the production line. At the time of attaching the internal circuitry to the end terminals 12 and 14 of the leads 2 and 3, respectively, the assembler merely positions the circuit or component leads adjacent to the ends 12 and 14 and attaches them.

Besides being a means of support, the support members 15 and 16 may serve as a means of dissipating heat generated by the internal circuitry. The support members 15 and 16 may comprise a material having a coefficient of thermal conductivity sufficient to carry the heat away from the internal circuitry such that when attached to or positioned close to the heat source, they conduct the heat from said source. The end caps 5 and 8 may also serve as a heat sink by connecting the members 15 and 16 to said members in a heat conducting relationship, e.g. by soldering or welding. This feature of the support members 15 and 16 is especially advantageous when active components, e.g. transistors and diodes are utilized as part of the internal circuitry. The active elements may be mounted on the support members 15 and 16 and if said members comprise the proper material, they will carry the heat to the end caps and away from other internal circuitry.

Figures 3, 4:
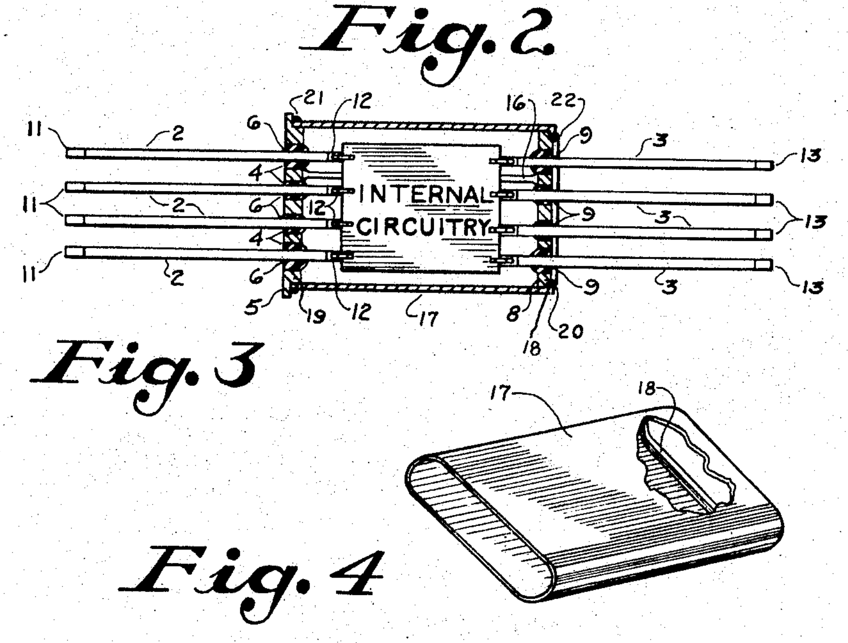
FIG. 3 represents a longitudinal cross-sectional view of the package assembly, taken along the line 3—3 of FIG. 1.
FIG. 4 illustrates, in perspective, a partially-sectioned view of the shield for the package assembly.

Also engaging the end members 5 and 8 is a shield member 17 being of substantially oblong cross-sectional shape substantially coinciding with the cross-sectional shape of the end caps 5 and 8. The end caps 5 and 8 and the shield member 17 are designed such that the shield member may be inserted during the latter processes of fabrication. The shield 17 carries an inwardly extending flange 18 about one of its end surfaces while the opposing end of the shield carries no such flange. The flange is illustrated in cross section in FIG. 3 and in the sectional perspective view of FIG. 4. The end cap 5 is constructed with a step-like shoulder 19. The step-like shoulder 19 may be viewed as having a low level and a high level. The circumference of the lower level is slightly smaller than the circumference of the unflanged end of the shield 17 while the high level circumference is larger. The end cap 8 is also machined with a step-like shoulder 20 with similar high and low levels. However, the circumference of the high level of the shoulder 20 is approximately the same as that of the low level of the shoulder 19. The low level of the shoulder 20 is designed to accommodate the flange 18. Thus, the shield 17 is mounted in place by sliding the unflanged end over the end cap 8 and into position over the low level of the shoulder 19. The shield 17 abuts the high level of the shoulder 19 and the flange 18 abuts the high level of the shoulder 20.

Engaging the end caps 5 and 8, and the shield 17 are a pair of sealing rings 21 and 22 which may be in the form of a weld or a solder pre-form. The rings 21 and 22 attach the end caps 5 and 8, respectively, to the shield 17 and also seal the final assembly 1. Obviously, by proper selection of material of the end caps, shield and sealing rings, the packaged assembly can be made a hermetically-sealed device.

This structure permits positioning the shield 17 after the internal circuitry is attached to the leads 2 and 3 and the package is ready for final encapsulation. The method of encapsulating the internal circuit and its associated components is not a part of the present invention. It may be accomplished in any one of various known ways. For example, after the container is finally sealed by the rings 21 and 22, encapsulating material may be inserted through a small auxiliary hole (not shown in the drawings) positioned in one of the end caps 5 and 8. After the enclosure is internally filled, the auxiliary hole would then be sealed. Other methods may include sliding the shield 16 into near final position and leaving a gap between the end of the shield 17 and the end cap 5. Next, the entire assembly is immersed in a vat of insulating material and the cover slid into place while immersed. While immersed, the encapsulating material fills the internal voids of the assembly and when the cover is slid into place, the encapsulating material is entrapped therein.

The material of the various components, primarily the leads 2 and 3, the insulating sealers 6 and 9, the end caps 5 and 8, and the shield 17, of the present package is not critical. Metallic or non-metallic materials are acceptable for the end caps and the shield. However, during fabrication and operation of the completed package assembly, a considerable amount of heat may be involved. One source of heat is the current flowing through the leads 2 and 3 during operation. A second source is the components within the package. A third source of heat, and possibly the most severe contributor, is that resulting during the placement of the sealer rings 21 and 22 which generally involves a welding or soldering process. Heat causes expansion of the various elements of the assembly. Consequently, the key factor is to select materials of which the coefficients of thermal expansion are compatible. For example, the coefficient of thermal expansion of the leads 2 and 3 must be compatible with that of the associated sealers 6 and 9. Otherwise, expansion of a lead may cause cracks to appear in the sealer thereby deterring the seal and insulation between the leads and their associated end cap. Also, during the welding or the soldering process of the sealer rings 21 and 22, heat will be conducted to the shield 17 and the caps 5 and 8. Thus, the coefficient of thermal expansion of these materials must be compatible and the coefficient of thermal expansion of the end caps 5 and 8 must be compatible with that of the sealers 6 and 9.

The problem of selecting materials having compatible coefficients of thermal expansion is not new. It is a factor that must be taken into consideration in most electronic package assemblies. It has been been found that numerous materials will satisfy the neeeds of the present structure. For example, the leads 2 and 3 may comprise a Kovar (nickel, iron and cobalt alloy) material. Another widely-used lead material is Dumet, which is an alloy of nickel and iron surrounded by a layer of copper. Both Kovar and Dumet are widely-used lead materials. If a Kovar lead is used, the sealers 6 and 9 may include a ceramic or a hard glass insulating material. If a Dumet lead is used, a ceramic or a soft glass insulating material is acceptable. The end cap may be of the same material as the lead wire and the cover. For example, both may be of either nickel or a nickel-iron alloy, or one may be nickel while the other is a nickel-iron alloy. Also, proper selection of ferrous or non-ferrous materials will provide an electrostatic and/or magnetic shield thereby protecting the internal circuitry from stray fields.

The present structure permits full testing of the enclosed circuit prior to final encapsulation. These tests may include visual, mechanical adjustment, electrical adjustments, noise, aging, etc., all of which are generally performed. Since the tests are performed prior to final encapsulation, if the test results are not satisfactory, adjustments may be made at this stage of fabrication. This avoids the otherwise common procedure of encapsulating prior to testing which requires disposal of the assembly if the tests are usatisfactory.

Figure 2:
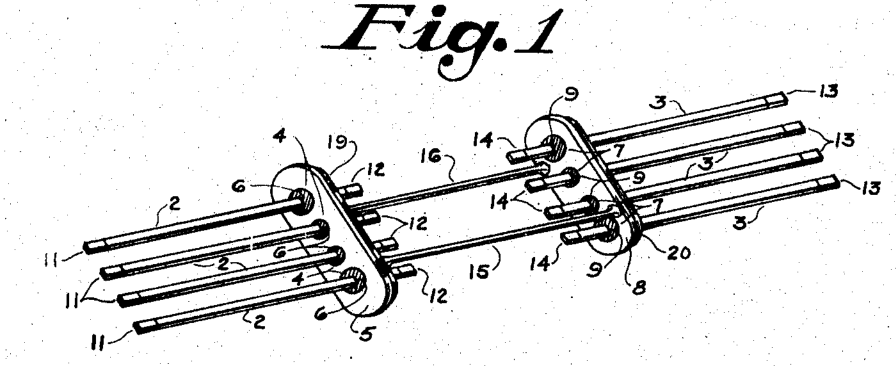
FIG. 2 illustrates the package assembly of FIG. 1 with the shielding member and the internal circuitry removed.

The present assembly is especially advantageous for packaging and testing thin film circuitry. At the present time, most thin film circuits are deposited on a glass substrate. After the circuit is deposited on the substrate, and prior to packaging, the glass is analyzed by shining light therethrough to determine whether or not there are scratches or other defects within the thin film circuit. The scratches, if existent, may cause an open circuit. Thus, it is important that the inspection be made. If there are no scratches or other defects, the circuit is ready for final packaging. The packaging requires more handling and though there were no scratches or other defects prior to packaging, due to the various handlings the surface may become scratched. This may occur in fabrication of the present assembly as well as those heretofore known. However, with previous assemblies, it was quite difficult, if not impossible, to thoroughly examine the thin film circuit after it was placed in its packaging assembly prior to final encapsulation. If any scratches occurred, the defect was not evident until the final testing procedure. Thus, it would be necessary to dispose of the entire assembly if the final test indicated scratches. The present structure overcomes this problem. It permits a duplication of the light shining test after the circuit is connected to the leads 2 and 3 and prior to final encapsulation. It will be noticed in FIG. 2 that after the circuit is positioned within the assembly and before it is finally encapsulated, the carrier is still visually open. Thus, light passes through the substrate thereby permitting duplication of the previous light test.

I claim:

1. An electronic package assembly comprising:
   (a) a first end cap carrying a plurality of electrical conducting leads protruding therethrough;
   (b) a second end cap carrying a plurality of electrical conducting leads protruding therethrough;
   (c) support means extending between and joining said first and second end caps to support said first and second end caps in spaced apart and in substantially parallel relationship to each other to thereby establish an independently rigid assembly;
   (d) an electronic element comprising a flat substrate carrying a circuit network with end terminals at two opposite ends thereof;
   (e) said electronic element being a complete and independent unit located between said end caps and adjacent to at least one said support means with said end terminals connected to respective conducting leads;
   (f) a shield member extending between and engaging at opposite longitudinal ends of the first and second end caps to thereby enclose the volume between said first and second caps.

2. The package assembly of claim 1 wherein said support means are heat conductors to carry heat away from said electronic element through said adjacent relationship therebetween.

3. The package assembly of claim 1 wherein said electronic element is hermetically sealed within by sealing means betweeen said shield member and each said end cap.

References Cited

UNITED STATES PATENTS

| | | | |
|---|---|---|---|
| 2,093,302 | 9/1937 | Beggs | 174—50.56 X |
| 2,577,576 | 12/1951 | Glickman et al. | 174—17.08 |
| 3,188,382 | 6/1965 | Fuss | 174—91 X |

LEWIS H. MYERS, *Primary Examiner.*

H. W. COLLINS, *Examiner.*